(12) United States Patent
Huh et al.

(10) Patent No.: US 7,875,208 B2
(45) Date of Patent: Jan. 25, 2011

(54) CONDUCTIVE COPOLYMER, CONDUCTIVE COPOLYMER COMPOSITION, FILM AND OPTO-ELECTRONIC DEVICE USING THE SAME

(75) Inventors: Dal Ho Huh, Suwon-si (KR); Jeong Woo Lee, Anyang-si (KR); Mi Young Chae, Yongin-si (KR); Tae Woo Lee, Seoul (KR)

(73) Assignee: Cheil Industries Inc., Gumi-si (KR)

( * ) Notice: Subject to any disclaimer, the term of this patent is extended or adjusted under 35 U.S.C. 154(b) by 600 days.

(21) Appl. No.: 11/936,843

(22) Filed: Nov. 8, 2007

(65) Prior Publication Data

US 2008/0105854 A1    May 8, 2008

(30) Foreign Application Priority Data

Nov. 8, 2006    (KR) .................... 10-2006-0109751

(51) Int. Cl.
  *H01B 1/00*     (2006.01)
  *C08F 12/18*    (2006.01)
  *C08G 75/00*    (2006.01)
  *C08G 73/00*    (2006.01)
  *C08G 73/06*    (2006.01)

(52) U.S. Cl. .................... 252/500; 526/251; 528/373; 528/422; 528/423

(58) Field of Classification Search ................ 252/500; 526/251; 528/373, 422, 423
  See application file for complete search history.

(56) References Cited

U.S. PATENT DOCUMENTS

| | | |
|---|---|---|
| 4,539,507 A | 9/1985 | VanSlyke et al. |
| 4,720,432 A | 1/1988 | VanSlyke et al. |
| 4,769,292 A | 9/1988 | Tang et al. |
| 5,126,214 A | 6/1992 | Tokailin et al. |
| 6,613,855 B1 * | 9/2003 | Satake et al. ................ 526/247 |

FOREIGN PATENT DOCUMENTS

| | | |
|---|---|---|
| EP | 387715 A2 | 9/1990 |
| KR | 10-2007-0048076 A | 5/2007 |

OTHER PUBLICATIONS

Zhao et al., "Enhancement of Electrical Stability of Polyaniline Films in Aqueous Media by Surface Graft Copolymerization with Hydrophobic Monomers," Langmuir, 15, pp. 8259-8264 (1999).*

* cited by examiner

*Primary Examiner*—Mark Kopec
*Assistant Examiner*—Jaison P Thomas
(74) *Attorney, Agent, or Firm*—Summa, Additon & Ashe, P.A.

(57) ABSTRACT

Disclosed herein is a conductive copolymer. The conductive copolymer can prevent water-absorbance, lower the concentration of polyacid contained in a molecule and exhibit superior film characteristics and excellent storage stability via a reduction in aggregation between molecules, as well as impart improved efficiency and lifetime to optoelectronic devices. The conductive copolymer includes a conductive polymer doped with a polyacid copolymer represented by Formula 1 below:

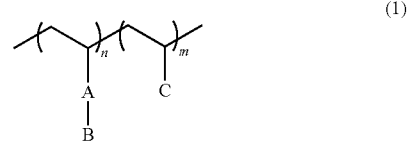

(1)

Further disclosed are a conductive copolymer composition, a conductive copolymer composition film and an organic optoelectronic device, each including the conductive copolymer.

22 Claims, 3 Drawing Sheets

CONDUCTIVE COPOLYMER, CONDUCTIVE COPOLYMER COMPOSITION, FILM AND OPTO-ELECTRONIC DEVICE USING THE SAME

CROSS REFERENCE TO RELATED APPLICATION

This application claims priority from Korean Patent Application No. 2006-0109751, filed Nov. 8, 2006, which is hereby incorporated by reference in its entirety.

BACKGROUND OF THE INVENTION

1. Field of the Invention

The present invention relates to a conductive copolymer, a conductive copolymer composition, a conductive copolymer composition film and an organic optoelectronic device using the same.

2. Description of the Related Art

Optoelectronic devices, e.g., organic light emitting diodes (hereinafter, referred to simply as "OLEDs"), organic solar cells and organic transistors, convert electric energy into light energy, and vice versa.

In particular, with technical developments in the field of flat panel displays (hereinafter, referred to simply as "FPDs"), OLEDs have recently attracted much attention.

Based on rapid technical development, liquid crystal displays (LCDs) have the highest market share (i.e., 80% or more) in the flat panel display products. However, large-screen (e.g., 40 inch or more) LCDs have drawbacks in terms of slow response speed, narrow viewing angle, and the like. There is a need for a novel display to overcome these drawbacks.

Under these circumstances, since organic light emission diodes have advantages of low driving voltage, self-luminescence, slimness, wide viewing angle, rapid response speed, high contrast, and low cost, they have been the focus of intense interest as the only devices capable of satisfying all requirements for next-generation FPDs.

In recent years, a great deal of research has been conducted in the field of optoelectronic devices including OLEDs in order to form a conductive copolymer film capable of favorably transporting charges (i.e., holes and electrons) created on electrodes into an optoelectronic device, and thus realizing high efficiency of the device.

When a current is applied to a thin film composed of a fluorescent or phosphorescent organic compound (hereinafter, referred to simply as an "organic film"), electrons are recombinated with holes in the organic film to emit light. OLEDs are self-luminescent devices employing such a phenomenon. To improve luminescence efficiency and lower a driving voltage, OLEDs generally have a multilayer structure including a hole injection layer, a light emission layer and an electron injection layer as organic layers, rather than a monolayer structure exclusively consisting of a light emission layer.

The multilayer structure can be simplified by leaving one multifunctional layer and omitting other layers. OLEDs may have the simplest structure including two electrodes, and a light emission layer interposed between the two electrodes. In this case, the light emission layer is an organic layer capable of performing all functions.

However, for substantial improvement in luminance of OLEDs, an electron injection layer or a hole injection layer must be introduced into a light-emission assembly.

A variety of organic compounds that transport charges (holes or electrons) are disclosed in patent publications. Materials for the organic compounds and use thereof are generally disclosed, for example, in EP Patent Publication No. 387,715, and U.S. Pat. Nos. 4,539,507, 4,720,432, and 4,769,292.

A charge transporting organic compound currently used in organic EL devices is poly(3,4-ethylenedioxythiophene)-poly(4-styrenesulfonate) (PEDOT-PSS) in the form of an aqueous solution, which is commercially available from Bayer AG under the trade name "Baytron-P".

PEDOT-PSS is widely used in fabrication of OLEDs. For example, PEDOT-PSS is deposited on an electrode made of a material, e.g., indium tin oxide (ITO) by spin coating to form a hole injection layer. PEDOT-PSS is represented by Formula 2 below:

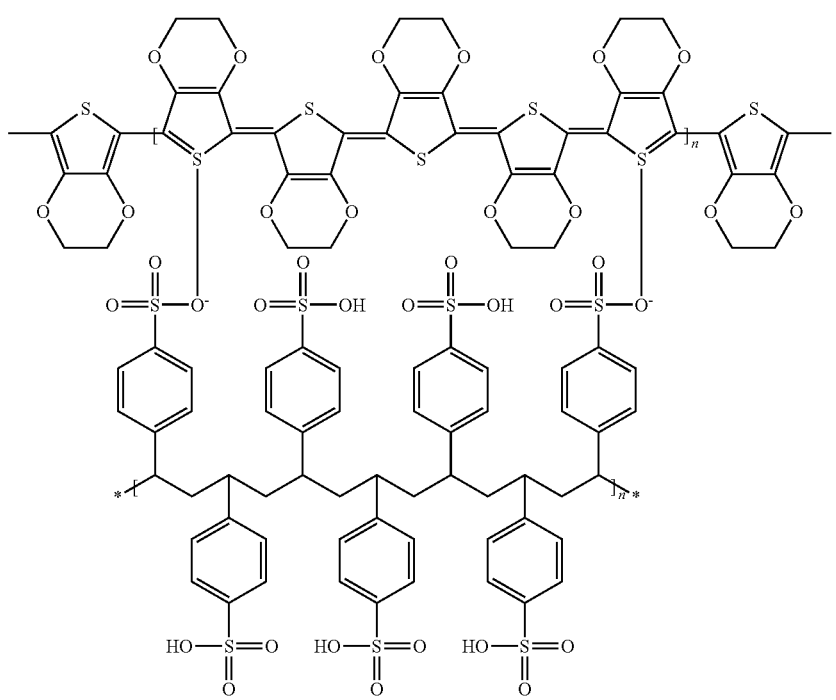

(2)

PEDOT-PSS has a structure in which PEDOT is doped with aqueous polyacid as an ionic complex of poly(3,4-ethylenedioxythiophene) (PEDOT) with polyacid of poly(4-styrenesulfonate) (PSS).

In the case where a conductive polymer composition comprising PEDOT-PSS is used to form a hole injection layer, PSS is deteriorated and thus dedoped due to its superior water-absorbability, or is reacted with electrons and thus decomposed, thereby releasing a material such as sulfate. The released material may be diffused into adjacent organic films, e.g., light-emitting layer. The diffusion of the material from the hole injection layer to the light-emitting layer leads to exciton quenching, thus causing deterioration in the efficiency and lifetime of OLEDs.

SUMMARY OF THE INVENTION

In accordance with one aspect of the present invention, there is provided a conductive copolymer capable of preventing water-absorbance, lowering the concentration of polyacid contained in a molecule and exhibiting superior film characteristics and excellent storage stability via a reduction in aggregation between molecules, as well as imparting improved efficiency and prolonged lifetime to optoelectronic devices.

The conductive copolymer comprises a conductive polymer doped with a polyacid copolymer represented by Formula 1 below:

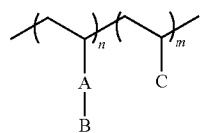

(1)

wherein A, B, C, n and m will be defined as follows.

In accordance with another aspect of the present invention, there is provided a conductive copolymer composition prepared from the conductive copolymer.

In accordance with another aspect of the present invention, there is provided a conductive copolymer composition film produced using the conductive copolymer composition.

In accordance with yet another aspect of the present invention, there is provided an organic optoelectronic device fabricated using the conductive copolymer composition.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1A:
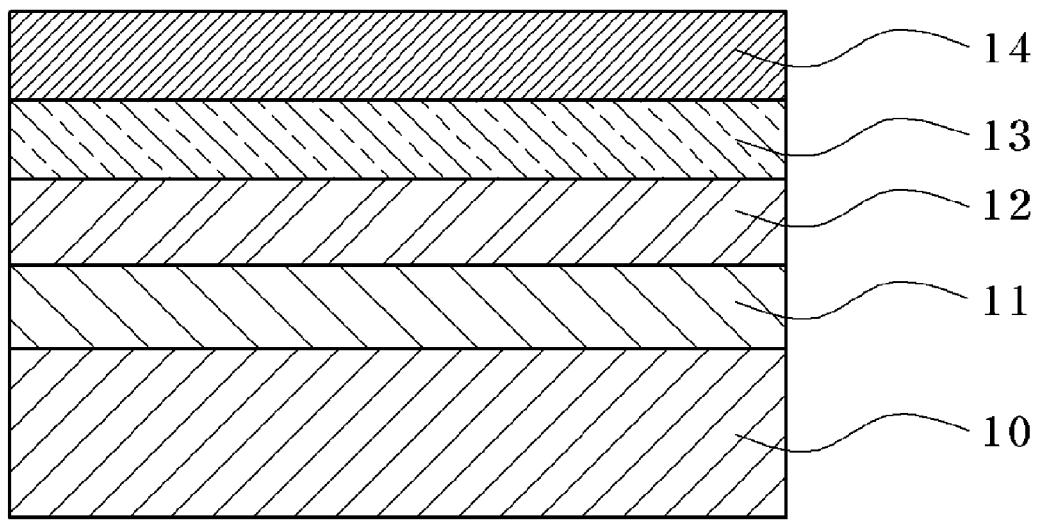
FIGS. 1a to 1d are cross-sectional views schematically illustrating a laminated structure of an organic light-emitting diode according to one embodiment of the present invention, respectively.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

In one aspect, the present invention is directed to a conductive copolymer comprises a conductive polymer doped with a polyacid copolymer represented by the following Formula 1:

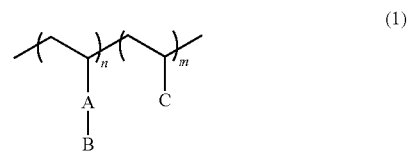

(1)

wherein $0 < m \leq 10{,}000{,}000$, $0 \leq n < 10{,}000{,}000$, and $0.0001 \leq m/n \leq 100$;

A is a carbon compound selected from the group consisting of substituted or unsubstituted $C_1$-$C_{30}$ alkyl groups, substituted or unsubstituted $C_1$-$C_{30}$ heteroalkyl groups, substituted or unsubstituted $C_1$-$C_{30}$ alkoxy groups, substituted or unsubstituted $C_1$-$C_{30}$ heteroalkoxy groups, substituted or unsubstituted $C_6$-$C_{30}$ aryl groups, substituted or unsubstituted $C_6$-$C_{30}$ arylalkyl groups, substituted or unsubstituted $C_6$-$C_{30}$ aryloxy groups, substituted or unsubstituted $C_2$-$C_{30}$ heteroaryl groups, substituted or unsubstituted $C_2$-$C_{30}$ heteroarylalkyl groups, substituted or unsubstituted $C_2$-$C_{30}$ heteroaryloxy groups, substituted or unsubstituted $C_5$-$C_{30}$ cycloalkyl groups, substituted or unsubstituted $C_2$-$C_{30}$ heterocycloalkyl groups, substituted or unsubstituted $C_1$-$C_{30}$ alkylester groups, substituted or unsubstituted $C_1$-$C_{30}$ heteroalkylester groups, substituted or unsubstituted $C_6$-$C_{30}$ arylester groups, and substituted or unsubstituted $C_2$-$C_{30}$ heteroarylester groups, wherein at least one hydrogen bound to carbon of each functional group A may be optionally substituted with another functional group (such as a halogen atom, a hydroxyl group, a nitro group, a cyano group, an amino group (e.g., —$NH_2$, —$NH(R)$, or —$N(R')(R'')$, where R' and R'' are each independently a $C_1$-$C_{10}$ alkyl group), an amidino group, a hydrazine group, or a hydrozone group, as discussed below);

B is an ionic group or an ionic compound, wherein the ionic compound comprises a cation and an anion pair with each other, wherein the cation is selected from: metal ions including $Na^+$, $K^+$, $Li^+$, $Mg^{2+}$, $Zn^{2+}$ and $Al^{3+}$; and organic ions including $H^+$, $NH_3^+$ and $CH_3$(—$CH_2$—)$_n$ (wherein n is an integer from 1 to 50), and the anion is selected from $PO_3^-$, $SO_3^-$, $COO^-$, $I^-$ and $CH_3COO^-$; and C is a carbon compound containing a plurality of halogen atoms, for example, a $C_2$-$C_{30}$ compound substituted with halogen atoms in an amount of 50% or more than hydrogen atoms. The $C_2$-$C_{30}$ compound may optionally include a heteroatom such as nitrogen, phosphorous, sulfur, silicon and oxygen.

C serves to impart a variation in the morphology to the copolymer via dipole-dipole interaction or hydrophobic action.

The polyacid copolymer of Formula 1 is doped in the conductive polymer in the form of an ionic bond.

In another aspect, the present invention is directed to a conductive copolymer composition comprising a dispersion of the conductive copolymer in a solvent, and a physical and/or chemical crosslinking agent.

Any conductive polymer commonly used in organic optoelectronic devices may be employed in the present invention. Exemplary conductive polymers useful in the invention can include one or more polymers of at least two monomers selected from: polyphenylene, polyphenylenevinylene, polyaniline represented by the following Formula 3, or derivatives thereof; pyrrole or thiophene represented by the following Formula 4, or derivatives thereof; and cyclic compounds represented by the following Formula 5 or derivatives thereof:

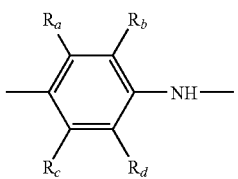
(3)

wherein $R_a$, $R_b$, $R_c$ and $R_d$ are each independently selected from the group consisting of hydrogen, $C_1$-$C_{30}$ alkyl groups, $C_1$-$C_{30}$ heteroalkyl groups, $C_1$-$C_{30}$ alkoxy groups, $C_1$-$C_{30}$ heteroalkoxy groups, $C_6$-$C_{30}$ aryl groups, $C_6$-$C_{30}$ arylalkyl groups, $C_6$-$C_{30}$ aryloxy groups, $C_6$-$C_{30}$ arylamine groups, $C_6$-$C_{30}$ pyrrole groups, $C_6$-$C_{30}$ thiophene groups, $C_2$-$C_{30}$ heteroaryl groups, $C_2$-$C_{30}$ heteroarylalkyl groups, $C_2$-$C_{30}$ heteroaryloxy groups, $C_5$-$C_{30}$ cycloalkyl groups, $C_2$-$C_{30}$ heterocycloalkyl groups, $C_1$-$C_{30}$ alkylester groups, $C_1$-$C_{30}$ heteroalkylester groups, $C_6$-$C_{30}$ arylester groups and $C_2$-$C_{30}$ heteroarylester groups, wherein at least one hydrogen bonded to carbon contained in $R_a$, $R_b$, $R_c$ and $R^d$ may be optionally substituted with another functional group (such as defined above with regard to Formula 1);

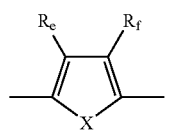
(4)

wherein X is a NH group, or a $C_1$-$C_{20}$ alkyl group or a $C_6$-$C_{20}$ aryl group, wherein each $C_1$-$C_{20}$ alkyl group or $C_6$-$C_{20}$ aryl group is bonded to a heteroatom selected from N, O, P and S; and $R_e$ and $R_f$ are each independently selected from the group consisting of a NH group, $C_1$-$C_{20}$ alkyl groups or $C_6$-$C_{20}$ aryl groups, wherein each $C_1$-$C_{20}$ alkyl group or $C_6$-$C_{20}$ aryl group is bonded to a heteroatom selected from N, O, P and S, $C_1$-$C_{30}$ alkyl groups, $C_6$-$C_{30}$ aryl groups, $C_1$-$C_{30}$ alkoxy groups, $C_1$-$C_{30}$ heteroalkyl groups, $C_1$-$C_{30}$ heteroalkoxy groups, $C_6$-$C_{30}$ arylalkyl groups, $C_6$-$C_{30}$ aryloxy groups, $C_6$-$C_{30}$ arylamine groups, $C_6$-$C_{30}$ pyrrole groups, $C_6$-$C_{30}$ thiophene groups, $C_2$-$C_{30}$ heteroaryl groups, $C_2$-$C_{30}$ heteroarylalkyl groups, $C_2$-$C_{30}$ heteroaryloxy groups, $C_5$-$C_{30}$ cycloalkyl groups, $C_2$-$C_{30}$ heterocycloalkyl groups, $C_1$-$C_{30}$ alkylester groups, $C_1$-$C_{30}$ heteroalkylester groups, $C_6$-$C_{30}$ arylester groups and $C_2$-$C_{30}$ heteroarylester groups, wherein at least one hydrogen bonded to carbon contained in $R_e$ and $R_f$ may be optionally substituted with another functional group (such as defined above with regard to Formula 1); and

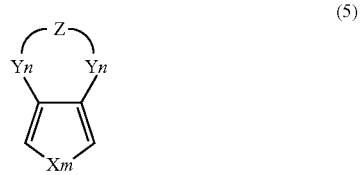
(5)

wherein X is a NH group, a $C_1$-$C_{20}$ alkyl group or a $C_6$-$C_{20}$ aryl group, wherein each $C_1$-$C_{20}$ alkyl group or $C_6$-$C_{20}$ aryl group is bonded to a heteroatom selected from N, O, P and S;

each Y is independently a NH group or a $C_1$-$C_{20}$ alkyl group or a $C_6$-$C_{20}$ aryl group, wherein each $C_1$-$C_{20}$ alkyl group or a $C_6$-$C_{20}$ aryl group is bonded to a heteroatom selected from N, O, P and S;

m and n are independently an integer from 0 to 9; and

Z is —$(CH_2)_x$—$CR_gR_h$—$(CH_2)_y$—, where $R_g$ and $R_h$ are each independently hydrogen, a $C_1$-$C_{20}$ alkyl radical or a $C_6$-$C_{14}$ aryl radical, or —$CH_2$—$OR_i$, where $R_i$ is hydrogen, $C_1$-$C_6$ alkyl acid, $C_1$-$C_6$ alkylester, $C_1$-$C_6$ heteroalkyl acid, or $C_1$-$C_6$ alkylsulfonic acid, and x and y are each independently an integer from 0 to 5, wherein at least one hydrogen bonded to carbon contained in Z may be optionally substituted with another functional group (such as defined above with regard to Formula 1).

The conductive copolymer of the present invention can contain a low amount of a moiety which is reacted with electrons and decomposed, and can undergo variation in the morphology caused by constituent functional groups, thus preventing distribution by electrons. Accordingly, optoelectronic devices comprising the conductive copolymer can exhibit high efficiency and long lifetime.

Specific examples of the substituent "alkyl group" as used herein can include without limitation linear or branched alkyl groups such as methyl, ethyl, propyl, isobutyl, sec-butyl, tert-butyl, pentyl, iso-amyl and hexyl. At least one hydrogen atom contained in the alkyl group may be optionally substituted with a functional substituent group such as but not limited to a halogen atom, a hydroxyl group, a nitro group, a cyano group, an amino group (e.g., —$NH_2$, —NH(R), or —N(R')(R"), where R' and R" are each independently a $C_1$-$C_{10}$ alkyl group), an amidino group, a hydrazine group, or a hydrozone group.

The substituent "heteroalkyl group" as used herein refers to an alkyl group that contains at least one carbon, for example one to five carbons, substituted with heteroatoms selected from N, O, P and S atoms. At least one hydrogen atom contained in the heteroalkyl group may be optionally substituted with a functional substituent group which can be selected from the same optional functional substituent groups as defined above with respect to the substituent "alkyl group."

The substituent "aryl group" as used herein refers to a carbocyclic aromatic system including one or more aromatic rings in which the rings may be attached together in a pendent manner or may be fused. Specific examples of the aryl group can include without limitation aromatic groups, such as phenyl, naphthyl, tetrahydronaphthyl, and the like. At least one hydrogen atom contained in the aryl group may be optionally substituted with a functional substituent group which can be selected from the same optional functional substituent groups as defined above with respect to the substituent "alkyl group".

The substituent "heteroaryl group" as used herein refers to a $C_6$-$C_{30}$ cyclic aromatic system consisting of one to three heteroatoms selected from N, O, P and S atoms and the remaining ring carbon atoms in which the rings may be attached together in a pendant manner or may be fused. At least one hydrogen atom included in the heteroaryl group may be optionally substituted with a functional substituent group which can be selected from the same optional functional substituent groups as defined with respect to the substituent "alkyl group".

Specific examples of the alkoxy group can include without limitation methoxy, ethoxy, propoxy, isobutyloxy, sec-butyloxy, pentyloxy, iso-amyloxy and hexyloxy. At least one hydrogen atom contained in the alkoxy group may be optionally substituted with a functional substituent group which can be selected from the same optional functional substituent groups as defined above with respect to the substituent "alkyl group."

The substituent "arylalkyl group" as used herein refers to a substituent in which hydrogen atoms included in the aryl group defined above are partly substituted with lower alkyl groups, such as methyl, ethyl and propyl radicals. Examples of the arylalkyl group can include without limitation benzyl and phenylethyl. At least one hydrogen atom included in the arylalkyl group may be optionally substituted with a functional substituent group which can be selected from the same optional functional substituent groups as defined with respect to the substituent "alkyl group."

The substituent "heteroarylalkyl group" as used herein refers to a substituent in which hydrogen atoms included in the heteroaryl group defined above are partly substituted with lower alkyl groups. The heteroaryl group contained in the heteroarylalkyl group is the same as defined above. At least one hydrogen atom included in the arylalkyl group may be optionally substituted with a functional substituent group which can be selected from the same optional functional substituent groups as defined with respect to the substituent "alkyl group".

The substituent "aryloxy group" as used herein represents radical-O-aryl wherein aryl is as defined above. Specific examples of the aryloxy group can include without limitation phenoxy, naphthoxy, anthracenyloxy, phenanthrenyloxy, fluorenyloxy, and indenyloxy. At least one hydrogen atom included in the aryloxy group may be optionally substituted with a functional substituent group which can selected from the same optional functional substituent groups as defined with respect to the substituent "alkyl group."

The substituent "heteroaryloxy group" as used herein represents radical-O-heteroaryl wherein heteroaryl is as defined above. At least one hydrogen atom included in the heteroaryloxy group may be optionally substituted with a functional substituent group which can be selected from the same functional substituent groups as defined with respect to the substituent "alkyl group."

The substituent "cycloalkyl group" as used herein refers to a monovalent monocyclic system having 5 to 30 carbon atoms. At least one hydrogen atom included in the cycloalkyl group may be optionally substituted with a functional substituent group which can be selected from the same functional substituent groups as defined with respect to the substituent "alkyl group."

The substituent "heterocycloalkyl group" as used herein refers to a $C_5$-$C_{30}$ monovalent monocyclic system in which one to three heteroatoms selected from N, O, P and S are included, and the remaining ring atoms are carbon. At least one hydrogen atom included in the cycloalkyl group may be optionally substituted with a functional substituent group which can be selected from the same functional substituent groups as defined with respect to the substituent "alkyl group."

The substituent "amino group" as used herein refers to —$NH_2$, —NH(R) or —N(R')(R") where R' and R" are each independently a $C_1$-$C_{10}$ alkyl group.

Specific examples of halogen atoms as used herein include fluorine, chlorine, bromide, iodine and astatine.

The conductive copolymer according to one embodiment of the present invention comprises the polymer doped with the polyacid copolymer of Formula 1 in the form of ionic bond.

To produce a film using the conductive copolymer, the conductive copolymer can be dispersed in a solvent to prepare a composition.

The composition is defined as a "conductive copolymer composition". If necessary, the conductive copolymer composition may further include an organic ionic salt, a physical crosslinking agent or a chemical crosslinking agent, in addition to the solvent.

Any solvent can be used for the conductive copolymer composition of the present invention so long as it can substantially dissolve the conductive copolymer. Exemplary solvents useful in the present invention can include at least one solvent selected from the group consisting of water, alcohol, dimethylformamide (DMF), dimethylsulfoxide (DMSO), toluene, xylene, chlorobenzene, and the like, and mixtures thereof.

The conductive copolymer composition of the present invention may further comprise a crosslinking agent to improve the degree of crosslinking of the conductive copolymer. The crosslinking agent can include a physical crosslinking agent and/or a chemical crosslinking agent.

The physical crosslinking agent refers to a low or high molecular weight compound having at least one hydroxyl (OH) group, which functions to physically crosslink polymer chains without any chemical bond.

Specific examples of the physical crosslinking agents can include without limitation low molecular weight compounds such as glycerol and butanol, and high molecular weight compounds such as polyvinyl alcohol and polyethyleneglycol. In addition, other specific examples of physical crosslinking agents can include without limitation polyethylenimine and polyvinylpyrolidone.

The content of the physical crosslinking agent in the composition of the present invention can be about 0.001 to about 5 parts by weight, for example, about 0.1 to about 3 parts by weight, based on 100 parts by weight of the conductive copolymer composition.

When the physical crosslinking agent is used in an amount within the range as defined above, it can efficiently crosslink and can impart the desired film morphology to the conductive copolymer thin film.

The chemical crosslinking agent refers to a chemical material which can chemically crosslink compounds, induce in-situ polymerization, and form an interpenetrating polymer network (IPN).

Exemplary chemical crosslinking agents can include silanes such as tetraethyloxysilane (TEOS). In addition, specific examples of chemical crosslinking agents can include without limitation polyaziridines, melamines and epoxies.

The content of the chemical crosslinking agent in the composition of the present invention can be about 0.001 to about 50 parts by weight, for example, about 1 to about 10 parts by weight, based on 100 parts by weight of the conductive copolymer composition.

When the chemical crosslinking agent is used in an amount within the range as defined above, it can efficiently crosslink, and may not significantly influence the conductive polymer, and thus can sufficiently maintain the conductivity of a conductive copolymer thin film.

To produce a conductive copolymer film using the conductive copolymer composition as mentioned above, the solvent must be mostly or substantially all removed from the composition.

In another aspect, the present invention is directed to a conductive copolymer film and an organic opto-electronic device produced using the conductive copolymer composition. Examples of the opto-electronic device can include without limitation organic light-emitting diodes, organic solar cells, and organic transistors and organic memory devices.

Hereinafter, an organic light-emitting diode (OLED), which can include the conductive copolymer composition of the present invention is applied, will be described in detail.

In an OLED, the conductive copolymer composition can be used in a charge injection layer (i.e., a hole injection layer or an electron injection layer) to inject holes and electrons into a light-emitting polymer, thereby improving the luminescence intensity and the device efficiency.

In an organic solar cell, the conducting polymer can be used for an electrode or an electrode buffer layer to increase quantum efficiency. In an organic transistor, the conducting polymer can be used as an electrode material for a gate, a source-drain electrode, and the like.

The structure of an OLED employing the composition according to the present invention and a method for fabricating the OLED will be described.

FIGS. 1a to 1d are cross-sectional views schematically illustrating the structure of an OLED according to an exemplary embodiment of the present invention, respectively.

The OLED shown in FIG. 1a comprises a first electrode 10, a hole injection layer (HIL) 11 (also called as a "buffer layer") made of the conductive composition according to the present invention, a light emitting layer 12, a hole blocking layer (HBL) 13, and a second electrode 14 laminated in this order.

Figure 1B:
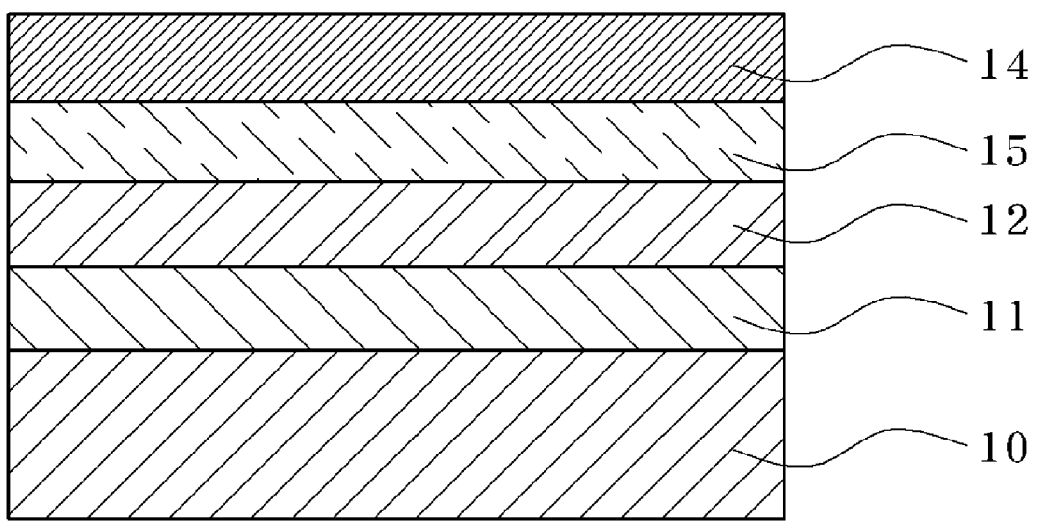

The OLED shown in FIG. 1b has the same laminated structure as that of FIG. 1a, except that an electron transport layer (ETL) 15 instead of the hole blocking layer (HBL) 13 is formed on the light emitting layer 12.

Figure 1C:
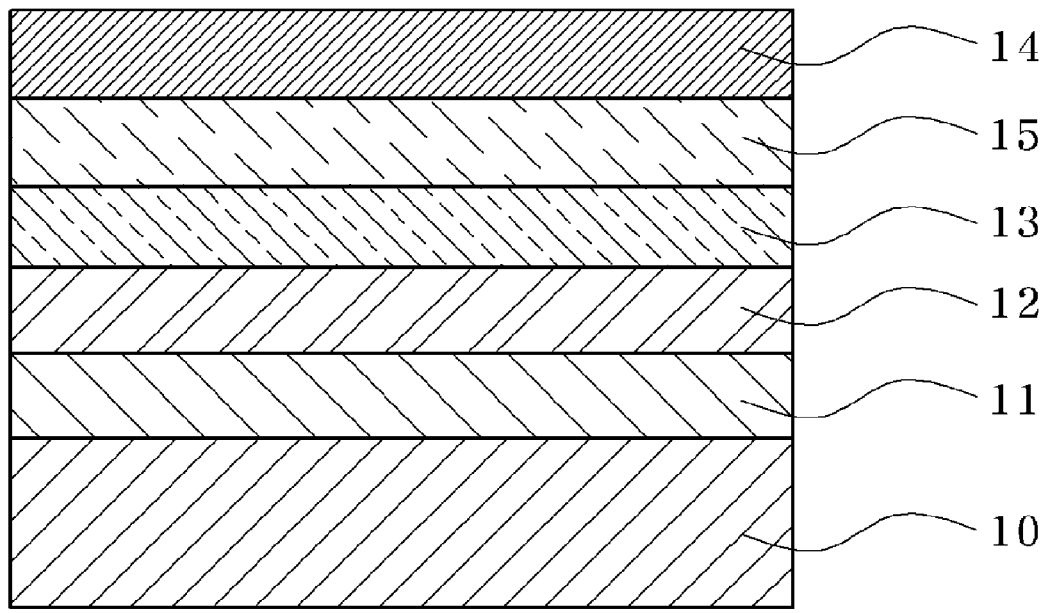

The OLED shown in FIG. 1c has the same laminated structure as that of FIG. 1a, except that a double-layer including a hole blocking layer (HBL) 13 and an electron transport layer (ETL) 15 are sequentially laminated, instead of the hole blocking layer (HBL) 13 being formed on the light emitting layer 12.

Figure 1D:
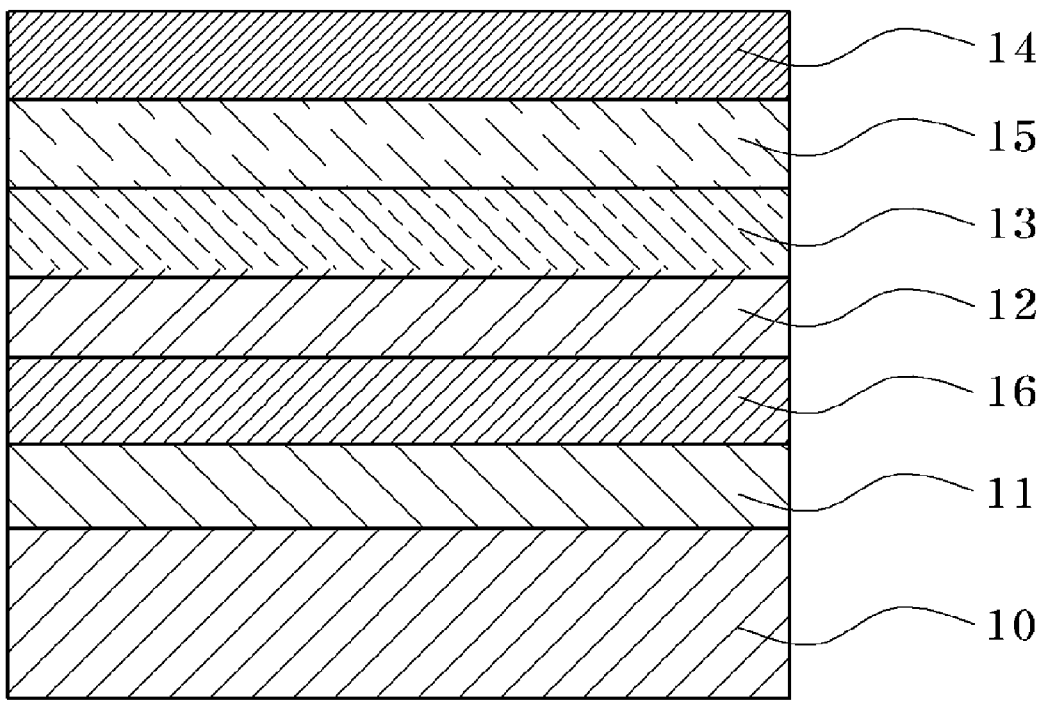

The OLED shown in FIG. 1d has the same structure as that of FIG. 1c, except that a hole transport layer (HTL) 16 is further formed between the electron transport layer (HIL) 11 and the light-emitting layer 12. The HTL 16 can prevent penetration of impurities from the HIL 11 to the light-emitting layer 12.

The OLEDs having the laminated structures as illustrated in FIGS. 1a to 1d, respectively, can be fabricated by general conventional methods as known in the art.

A general method of fabricating an OLED will be described in detail.

First, a first patterned electrode 10 can be formed on a substrate (not shown). The substrate used in the OLED of the present invention may be a substrate commonly used in the art. Examples include a glass or transparent plastic substrate because of their high transparency, superior surface smoothness, ease of handling, and excellent waterproofness. The thickness of the substrate can be about 0.3 to about 1.1 mm.

Materials for the first electrode 10 are not particularly limited. In a case where the first electrode 10 functions as an anode, the first electrode 10 can be made of an electrically conductive metal or its oxide through which holes are easily injected. Specific examples of materials for the first electrode can include without limitation indium tin oxide (ITO), indium zinc oxide (IZO), nickel (Ni), platinum (Pt), gold (Au), and iridium (Ir).

The substrate, on which the first electrode 10 can be formed, can be washed and subjected to UV-ozone treatment. The washing can be carried out using an organic solvent such as isopropanol (IPA) or acetone.

A hole injection layer (HIL) 11 including the composition of the present invention can be formed on the first electrode 10 of the washed substrate. The formation of HIL 11 can reduce contact resistance between the first electrode 10 and the light-emitting layer 12 and can improve the hole transporting performance of the first electrode 10 to the light emitting layer 12, thereby improving the driving voltage and the lifetime of the OLED.

The HIL 11 can be formed by spin coating the composition, which can be prepared by dissolving the conductive copolymer of the present invention in a solvent, on the first electrode 10, followed by drying.

The thickness of the HIL 11 may be about 5 to about 200 mm, for example, about 20 to about 100 mm. When the thickness of the HIL 11 is within this range, injection of holes can be fully performed and light transmittance can be sufficiently maintained. A light-emitting layer 12 can be formed on the HIL 11. Specific examples of materials for the light-emitting layer 12 can include, but are not necessarily limited to: materials for blue light emission selected from oxadiazole dimer dyes (Bis-DAPOXP), spiro compounds (Spiro-DPVBi, Spiro-6P), triarylamine compounds, bis(styryl) amine (DPVBi, DSA), FIrpic, CzTT, anthracene, TPB, PPCP, DST, TPA, OXD-4, BBOT, and AZM-Zn; materials for blue light emission selected from Coumarin 6, C545T, quinacridone and Ir(ppy)$_3$; and materials for red light emission selected from and DCM1, DCM2, Eu(thenoyltrifluoroacetone)$_3$ (Eu(TTA)$_3$), and butyl-6-(1,1,7,7-tetramethyljulolidyl-9-enyl)-4H-pyran (DCJTB).

In addition, examples of suitable light-emitting polymers can include, but are not limited to phenylene, phenylene vinylene, thiophene, fluorene, and spiro-fluorene-based polymers, and nitrogen-containing aromatic compounds.

The thickness of the light-emitting layer 12 may be about 10 to about 500 nm, for example, about 50 to about 120 nm. When the thickness of the emitting layer is within this range, an increase in leakage current and driving voltage can be adjusted to a desired level, and thus the lifetime of the OLED can be efficiently maintained.

If necessary, the composition for the light-emitting layer may further comprise a dopant.

The content of the dopant varies depending upon a material for the light-emitting layer, but may be generally about 30 to about 80 parts by weight based on 100 parts by weight of a material for the light-emitting layer (total weight of the host and the dopant).

When the content of the dopant is within this range, the luminescence properties of an OLED can be efficiently maintained. Specific examples of the dopant can include without limitation arylamines, perylenes, pyrroles, hydrazones, carbazoles, stylbenes, starbursts, and oxadiazoles, and the like.

The hole transport layer (HTL) 16 may be optionally formed between the HIL 11 and the light-emitting layer 12.

Materials suitable for the HTL is not particularly restricted and may include at least one material selected from the group consisting of carbazole and/or arylamine-containing compounds, phthalocyanine-based compounds, and triphenylene derivatives, each which is capable of transporting holes.

More specifically, the HTL may include at least one material selected from the group consisting of 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4''-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'-diamine (TPD), N,N'-di(naphthalene-2-yl)-N,N'-diphenyl benzidine (α-NPD), N,N'-diphenyl-N,N'-bis(1-naphthyl)-(1,1'-biphenyl)-4,4'-diamine (NPB), IDE320 (available from Idemitsu), poly(9,9-dioctylfluorene-co-N-(4-butylphenyl)diphenylamine (TFB), and poly(9,9-dioctylfluorene-co-bis-N,N-phenyl-1,4-phenylenediamine) (PFB), but is not limited thereto.

The thickness of the HTL 16 may be about 1 to about 100 nm, for example, about 50 to about 50 nm. When the thickness of the HTL 16 is within this range, hole transporting capability can be sufficiently maintained and the driving voltage can be adjusted to a desired level.

A hole blocking layer (HBL) 13 and/or an electron transport layer (ETL) 15 can be formed on the light-emitting layer 12 by deposition or spin coating. The HBL 13 can prevent migration of excitons from the light emitting material to the ETL 15 or migration of holes to the ETL 15.

Examples of suitable materials for the hole blocking layer (HBL) 13 may include without limitation phenanthroline-based compounds (e.g., BCP® available from UDC) represented by Formula 6, imidazole-based compounds represented by Formula 7, triazole-based compounds represented by Formula 8, oxadiazole-based compounds (e.g., PBDO) represented by Formula 9, and aluminium complexes (available from UDC) represented by Formula 10.

(6)

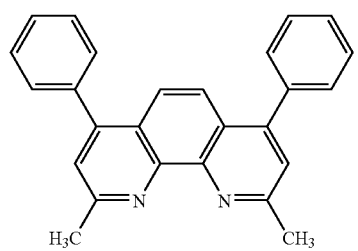

(7)

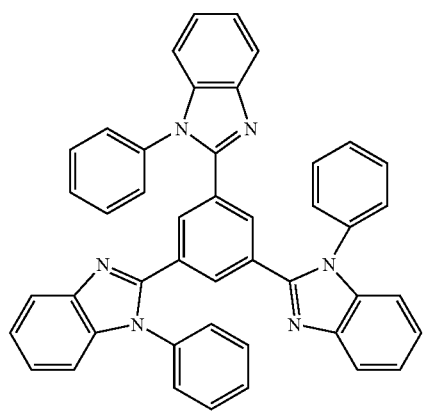

(8)

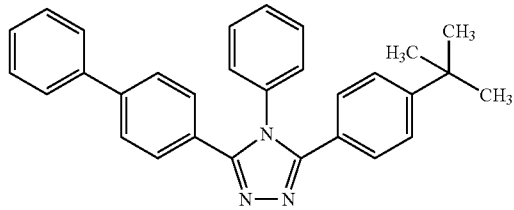

(9)

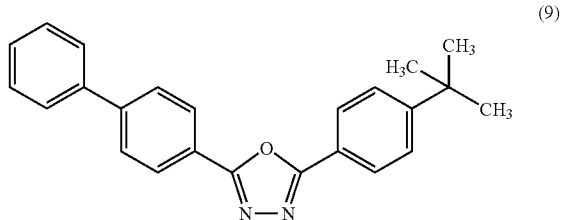

(10)

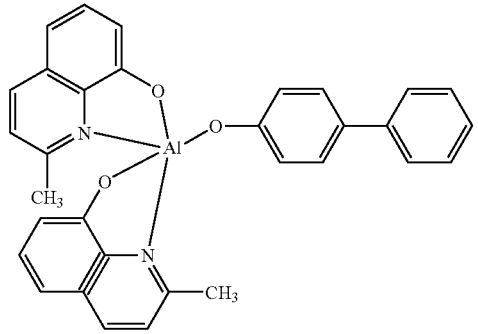

The thickness of the HBL 13 may be about 5 to about 100 nm, and the thickness of the ELT 15 may be about 5 to about 100 nm. When the thicknesses of the HBL 13 and ELT 15 are within this range, electron transporting performance and hole blocking performance can be efficiently maintained.

Examples of materials for the electron transport layer (ETL) 15 may include without limitation oxazoles, isoxazoles, triazoles, isothiazoles, oxadiazoles, thiadiazoles, perylenes represented by Formula 11, aluminium complexes (e.g., Alq$_3$ (tris(8-quinolinolato)-aluminium), BAlq, SAlq, and Almq$_3$ represented by Formulae 12 to 15, respectively), and gallium complexes (e.g., Gaq'2OPiv, Gaq'2OAc, 2(Gaq'2) represented by Formulae 16 to 18, respectively).

(11)

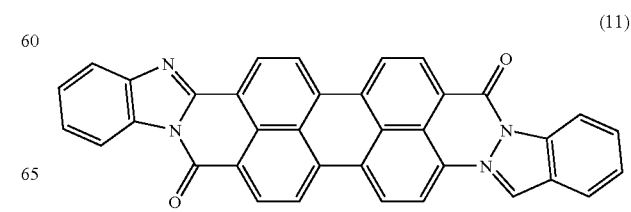

-continued

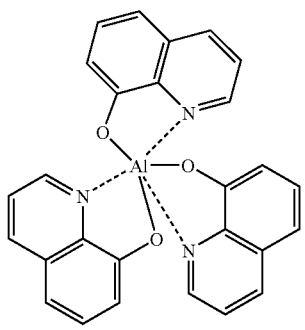
(12)

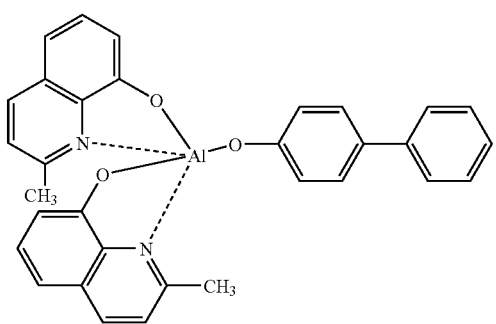
(13)

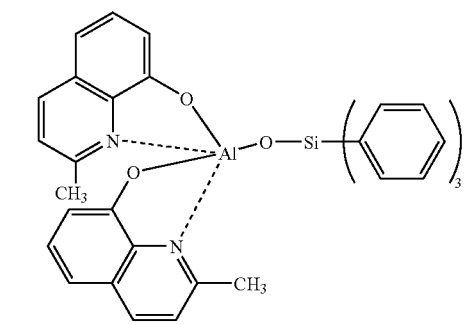
(14)

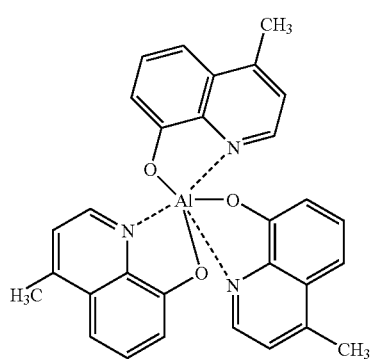
(15)

-continued

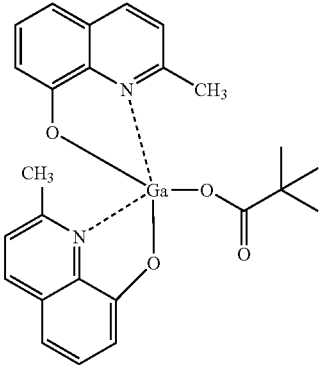
(16)

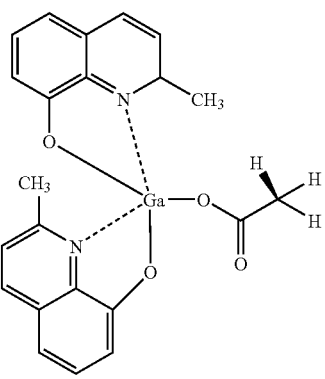
(17)

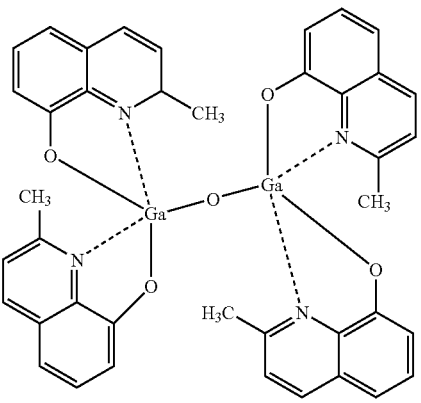
(18)

Then, a second electrode 14 can be formed on the laminated structure, followed by sealing, to fabricate an OLED.

Materials for the second electrode 14 are not particularly restricted, and examples thereof can include without limitation low work function metals, i.e. Li, Cs, Ba, Ca, Ca/Al, LiF/Ca, LiF/Al, BaF$_2$/Ca, Mg, Ag, Al, and alloys and multilayers thereof. The thickness of the second electrode 14 may be about 50 to about 3,000 Å.

No special apparatus or method is needed for the fabrication of the OLED according to the present invention. The OLED can be fabricated using the conductive copolymer composition of the present invention by any common process known in the art.

Hereinafter, the superiority of the conductive copolymer according to exemplary embodiments of the present invention will be demonstrated from specific description with reference to the following Examples. More specifically, the conductive copolymer can prevent water-absorbance, lower the concentration of polyacid contained in a molecule and exhibit superior film characteristics and excellent storage stability due to reduction in aggregation between molecules, as well as impart improved efficiency and prolonged lifetime to optoelectronic devices. Although not specifically mentioned herein, it will be apparent to those skilled in the art that detailed contents can be derived from the following description.

EXAMPLES

Example 1

Preparation of Styrenesulfonic Acid-Pentafluorostyrene Copolymer 48 g of sodium styrenesulfonate (SSNa) (available from Sigma-Aldrich Corp.) and 2.5 g of pentafluorostyrene (PFS) are fully dissolved in 0.6 L of dimethylsulfoxide (DMSO) with heating. Then, 0.3 g of azobisisobutyronitrile (AIBN) is added dropwise to the DMSO solution. The monomers are polymerized for 24 hours or more. The polymerization is carried out varying the content of pentafluorostyrene (PFS) (5, 10, and 20 wt %). The reaction product is allowed to sit at ambient temperature. Then, a precipitate is colleted from the reaction product and filtered with a filter to obtain a poly (styrenesulfonate-pentafluorostyrene) copolymer {P(SSNa-co-PFS)}.

The copolymer thus obtained is reacted with an ionic exchange resin to yield a poly(styrenesulfonic acid-pentafluorostyrene copolymer {P(SSA-co-PFS)) of Formula 19 below:

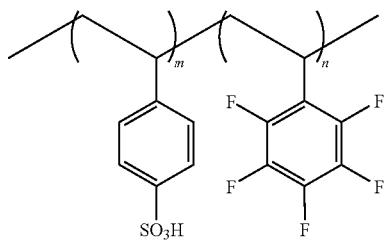

(19)

wherein m and n are as defined herein.

Example 2

Preparation of Styrenesulfonic Acid-Perfluorooctene Copolymer 16 g of sodium styrenesulfonate (SSNa) (available from Sigma-Aldrich Corp.) and 4 g of perfluorooctene (1H,1H,2H-perfluoro-1-octene) are fully dissolved in 0.24 L of dimethylsulfoxide (DMSO) with heating. Then, 0.1 g of azobisisobutyronitrile (AIBN) is added dropwise to the DMSO solution. The monomers are polymerized for 24 hours or more. The polymerization is carried out varying the content of perfluorooctene (5, 10, and 20 wt %). The reaction product is allowed to sit at ambient temperature. Then, a precipitate is colleted from the reaction product and filtered with a filter to obtain a poly(styrenesulfonate-perfluorooctene) copolymer {P(SSNa-co-PFO)}.

The copolymer thus obtained is reacted with an ionic exchange resin to yield a poly(styrenesulfonic acid-perfluorooctene copolymer {P(SSA-co-PFO)) of Formula 20 below:

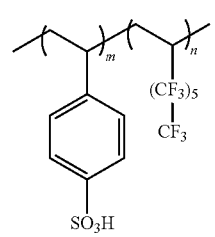

(20)

wherein m and n are as defined herein.

Example 3

Preparation of Styrenesulfonic Acid-Branched Perfluorooctene Copolymer 19 g of sodium styrenesulfonate (SSNa) (available from Sigma-Aldrich Corp.) and 1 g of branched perfluorooctene (heptafluoro-3,3-bis(trifluoromethyl)-1-hexene) are fully dissolved in 0.24 L of dimethylsulfoxide (DMSO) with heating. Then, 0.1 g of azobisisobutyronitrile (AIBN) is added dropwise to the DMSO solution. The monomers are polymerized for 24 hours or more. The polymerization is carried out varying the content of the branched perfluorooctene (5, 10, and 20 wt %).

The reaction product is allowed to sit at ambient temperature. Then, a precipitate is colleted from the reaction product, and filtered with a filter to obtain a poly(styrenesulfonate-branched perfluorooctene) copolymer {P(SSNa-co-BPFO)}.

The copolymer thus obtained is reacted with an ionic exchange resin to yield a poly(styrenesulfonic acid-branched perfluorooctene copolymer {P(SSA-co-BPFO)) of Formula 21 below:

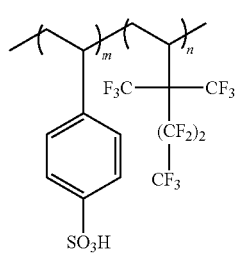

(21)

wherein m and n are as defined herein.

Example 4

Preparation of Poly(Styrenesulfonic Acid-Allyl Heptafluorobutyl Ether Copolymer 19 g of sodium styrenesulfonate (SSNa) (available from Sigma-Aldrich Corp.) and 1 g of allyl 1H,1H-heptafluorobutyl ether are fully dissolved in 0.24 L of dimethylsulfoxide (DMSO) with heating. Then, 0.1 g of azobisisobutyronitrile (AIBN) is added dropwise to the DMSO solution. The monomers are polymerized for 24 hours or more. The polymerization is carried out varying the content of the allyl 1H,1H-heptafluorobutyl ether (5, 10, and 20 wt %).

The reaction product is allowed to sit at ambient temperature. Then, a precipitate is colleted from the reaction product, and filtered with a filter to obtain a poly(styrenesulfonate-allyl heptafluorobutyl ether) copolymer {P(SSNa-co-AHFBE)).

The copolymer thus obtained is reacted with an ionic exchange resin to yield a poly(styrenesulfonic acid-allyl heptafluorobutyl ether copolymer {P(SSA-co-AHFBE)) of Formula 22 below:

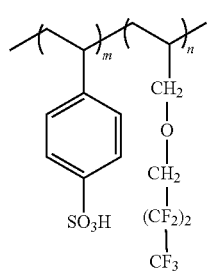

(22)

wherein m and n are as defined herein.

Example 5

Preparation of Poly(Styrenesulfonic Acid-Allylhexafluoro-Isopropanol Copolymer 19 g of sodium styrenesulfonate (SSNa) (available from Sigma-Aldrich Corp.) and 1 g of 2-Allylhexafluoro-isopropanol are fully dissolved in 0.24 L of dimethylsulfoxide (DMSO) with heating. Then, 0.1 g of azobisisobutyronitrile (AIBN) is added dropwise to the DMSO solution. The monomers are polymerized for 24 hours or more. The polymerization is carried out varying the content of the allylhexafluoro-isopropanol (2, 5, 10, and 20 wt %).

The reaction product is allowed to sit at ambient temperature. Then, a precipitate is colleted from the reaction product, and filtered with a filter to obtain a poly(styrenesulfonate-allylhexafluoro-isopropanol) copolymer {P(SSNa-co-AHFIP)).

The copolymer thus obtained is reacted with an ionic exchange resin to yield a poly(styrenesulfonic acid-allylhexafluoro-isopropanol copolymer {P(SSA-co-AHFIP)) of Formula 23 below:

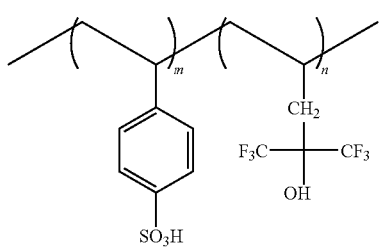

(23)

wherein m and n are as defined herein.

Example 6

Preparation of Doped Poly-3,4 Ethylenedioxythiophene Copolymer Composition

The copolymer prepared in Example 1 and 3,4-ethylenedioxythiophene (EDOT) are polymerized in an aqueous solution in the presence of ammonium sulfate as an oxidant in accordance with the compositions shown in Table 1.

The product and salts as a by-product are purified by ion exchange resin or dialysis. The content of the solid included in the polymer composition is 1.5% by weight. The solid is used to fabricate an OLED.

TABLE 1

| Sample No. | Hydrophobic group content (wt %) | EDOT content (wt %) | Reaction time (hour) |
|---|---|---|---|
| S-1 | 5 | 11 | 12 |
| S-2 | 5 | 11 | 24 |
| S-3 | 5 | 14 | 12 |
| S-4 | 5 | 14 | 24 |
| S-5 | 5 | 20 | 12 |
| S-6 | 5 | 20 | 24 |
| S-7 | 10 | 11 | 24 |
| S-8 | 10 | 14 | 24 |
| S-9 | 20 | 11 | 24 |
| S-10 | 20 | 14 | 24 |

Example 7

Fabrication of Organic Light-Emitting Diode

An ITO-deposited glass substrate (Corning, 15 $\Psi/cm^2$, 1,200 Å) is cut to a size 50 mm×50 mm×0.7 mm. The substrate is dipped in pure water/isopropyl alcohol, subjected to ultrasonic cleaning for about 5 minutes and UV-ozone cleaning for 30 minutes.

A hole injection layer is formed to a thickness of 300 nm on the substrate by spin-coating the conductive copolymer composition prepared in Example 6.

A light-emitting layer is formed to a thickness of 700 nm on the hole injection layer by depositing a green light-emitting polymer. A second electrode is formed to a thickness of 100 nm on the light-emitting layer by depositing LiF or Al. As a result, an OLED is finally fabricated.

The OLEDs fabricated from the conductive copolymer composition prepared in Example 6 are referred by the numbers shown in Table 2 below:

TABLE 2

| Sample No. | Conductive copolymer aqueous composition used (wt %) |
|---|---|
| D-1 | S-2 |
| D-2 | S-3 |
| D-3 | S-4 |
| D-4 | S-5 |

Comparative Example 1

Copolymer compositions are prepared in the same manner as in Example 6, except that polystyrenesulfonate (PSS) (available from Sigma-Aldrich Corp.) instead of the copolymer in Examples 1 to 5 as a polymer for doping is reacted with a doped poly-3,4-ethylenedioxythiophene for 12 and 24 hours, respectively, to prepare two copolymer compositions (referred to as "Ref-S1" and "Ref-S2").

Comparative Example 2

An organic light-emitting diode is fabricated in the same manner as in Example 7, except that an aqueous solution of PEDOT/PSS (Batron P 4083® available from Bayer AG) is used as a material for a hole injection layer. The organic light-emitting diode thus fabricated is referred to as a "the sample Ref-D".

<Evaluation of Luminescence Efficiency>

The luminescence efficiency of the samples D1 to D4 and Ref-D is measured using a SpectraScan PR650 spectroradiometer. The results are shown in Table 3 and FIGS. 2 and 3.

TABLE 3

| Experiment No. | Sample No. | Driving voltage (V) | Voltage & efficiency (based on 1,000 nit) | | Maximum efficiency | |
|---|---|---|---|---|---|---|
| | | | Current efficiency (Cd/A) | Power efficiency (lm/W) | Current efficiency (Cd/A) | Power efficiency (lm/W) |
| 1 | D-1 | 6.00 | 9.11 | 4.77 | 10.24 | 4.80 |
| 2 | D-2 | 5.60 | 10.46 | 5.87 | 11.73 | 5.90 |
| 3 | D-3 | 5.80 | 8.52 | 4.61 | 11.08 | 4.72 |
| 4 | D-4 | 6.20 | 8.18 | 4.15 | 10.16 | 4.18 |
| 5 | Ref-D | 6.20 | 7.65 | 3.88 | 10.23 | 4.02 |

Figure 2:
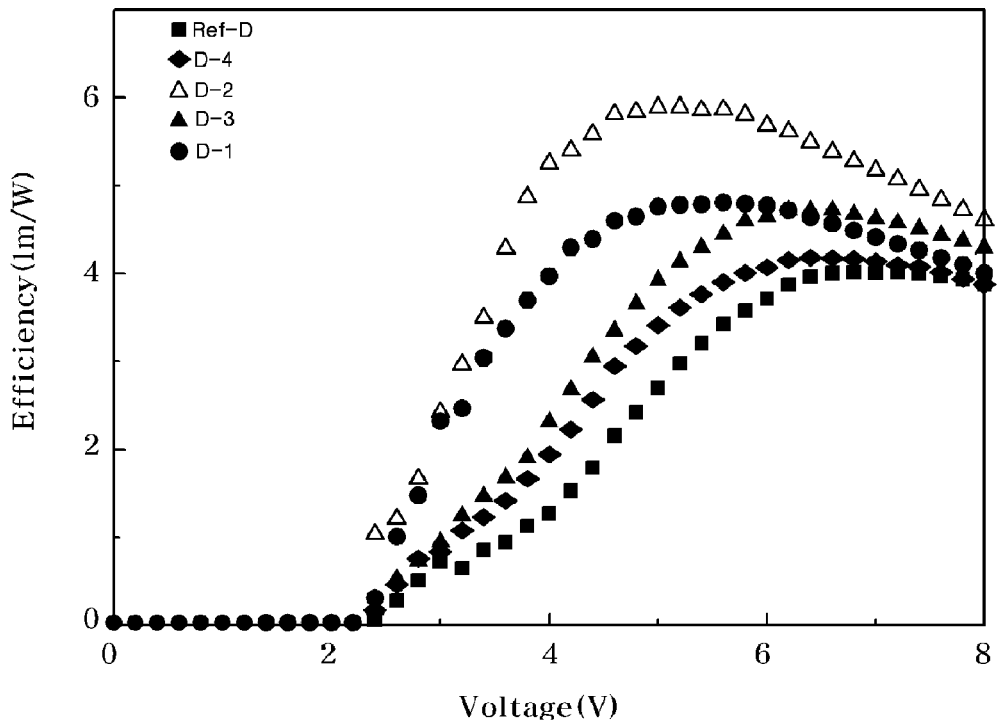
FIGS. 2 and 3 are graphs illustrating a comparison in the luminescence efficiency between organic light-emitting diodes fabricated in Examples and Comparative Examples.
Figure 3:
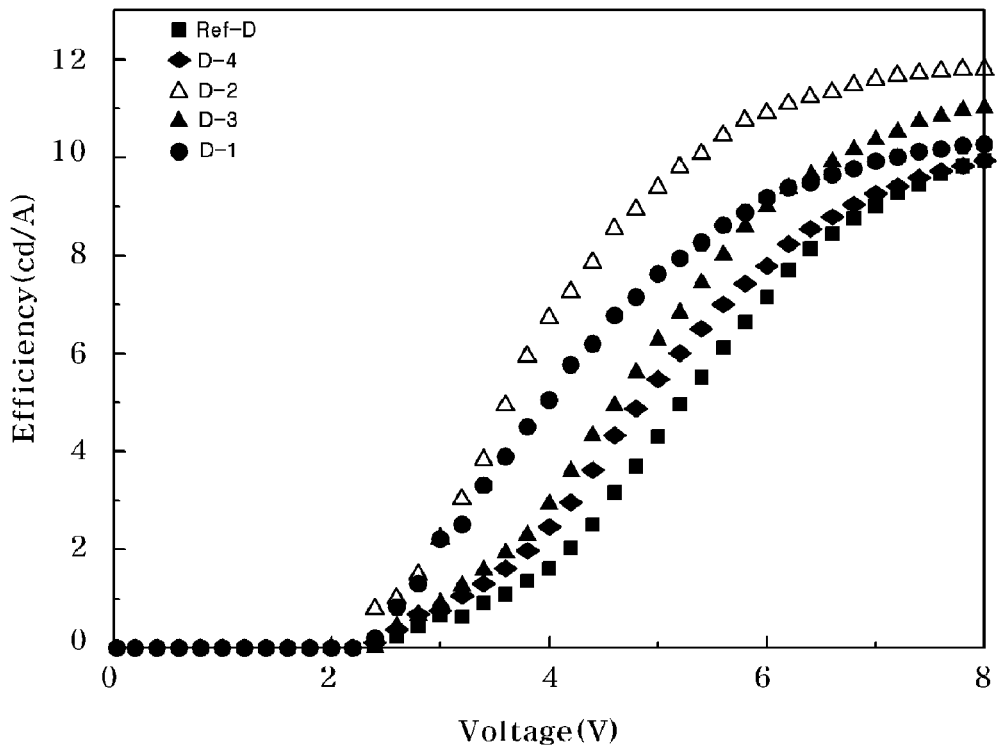

As can be seen from Table 3 and FIGS. 2 and 3, the sample D-2 exhibited the highest luminescence efficiency. More specifically, the current efficiency of the sample D-2 is about 10.5 cd/A, which reaches an increase of 36%, as compared to the sample Ref-D (about 7.7 cd/A). In addition, an increase in power efficiency of the sample D-2 was 51% of the sample Ref-D.

The data of Table 3 demonstrates that the samples D-1, D-3 and D-4 exhibit superior luminescence efficiency, as compared to the sample Ref-D. As a result, an OLED, which includes the conductive copolymer composition of the present invention as a material for a hole injection layer, demonstrates superior luminescence efficiency.

<Evaluation of Filterability>

To evaluate the filterability of the samples S-1 to S-10 and Ref-S of polymer composition, 10 mL of each sample is filtered through a syringe disk filter (PVDF, pore size: 0.45 μm, Millipore. Corp.). The results are shown in Table 4.

TABLE 4

| Sample No. | Hydrophobic group content (wt %) | EDOT content (wt %) | Reaction time (hour) | Filterability* |
|---|---|---|---|---|
| S-1 | 5 | 11 | 12 | Good |
| S-2 | 5 | 11 | 24 | Good |
| S-3 | 5 | 14 | 12 | Good |
| S-4 | 5 | 14 | 24 | Good |
| S-5 | 5 | 20 | 12 | Good |
| S-6 | 5 | 20 | 24 | Average |
| S-7 | 10 | 11 | 24 | Good |
| S-8 | 10 | 14 | 24 | Good |
| S-9 | 20 | 11 | 24 | Good |
| S-10 | 20 | 14 | 24 | Good |
| Ref-S1 | 0 | 14 | 12 | Average |
| Ref-S2 | 0 | 14 | 24 | Poor |

Note)
Level range of filterability*
Good: filterability of 10 mL
Average: filterability of 3 to 7 mL
Poor: filterability less than 2 mL As the content of 3,4-ethylenedioxythiophene (EDOT) increases, or the reaction time increases, filterability deteriorates. However, the data of Table 4 demonstrates that with the same content of EDOT (14 wt %), hydrophobic group-containing compositions exhibit superior filterability, as compared to compositions free of hydrophobic group (Samples Ref-S1 and Ref-S2). Furthermore, as apparent from Table 4, the sample S-6 with EDOT (20 wt %) can be filtered up to for 24 hours.

As a result, the data demonstrates that the conductive copolymer composition of the present invention prevents aggregation of solids which results from variation in the morphology caused by hydrophobic fluoro-substituents, and furthermore causes no aggregator even for long time storage, as compared to PEDOT/PSS.

<Evaluation of Acidity>

The acidity of the samples S-1 to S-6 and Ref-S is each measured using a pH meter (Orion 5 star). The results are shown in Table 5.

TABLE 5

| Sample No. | Hydrophobic group content (wt %) | EDOT content (wt %) | Reaction time (hour) | Acidity (pH) |
|---|---|---|---|---|
| S-1 | 5 | 11 | 12 | 3 |
| S-2 | 5 | 11 | 24 | 3 |
| S-3 | 5 | 14 | 12 | 3 |
| S-4 | 5 | 14 | 24 | 3 |
| S-5 | 5 | 20 | 12 | 3 |
| S-6 | 5 | 20 | 24 | 3 |
| Ref-S1 | 0 | 14 | 12 | 2 |
| Ref-S2 | 0 | 14 | 24 | 2 |

As can be seen from data shown in Table 5, the conductive copolymer compositions of the samples S-1 to S-6 exhibit low acidity, as compared to the reference samples, Ref-S1 and Ref-S2. This low acidity is based on a decrease in the content of the acidic group in the conductive copolymer compositions of the present invention.

As apparent from the foregoing, the conductive copolymer composition for an organic optoelectronic device according to the present invention can provide various advantages.

First, the conductive copolymer composition can prevent water absorbance.

Second, the conductive copolymer composition can also contain a low concentration of polyacid in a molecule. This can reduce problems associated with high acidity when the compositions are used in the manufacture of organic optoelectronic devices.

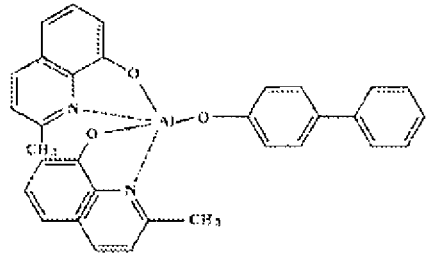

What is claimed is:

1. A conductive copolymer comprising a conductive polymer doped with a polyacid copolymer represented by Formula 1 below:

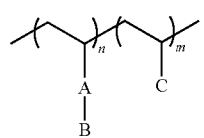

(1)

wherein $0 < m \leq 10{,}000{,}000$, $0 < n < 10{,}000{,}000$, and $0.0001 \leq m/n \leq 100$;

A is a carbon compound selected from the group consisting of substituted or unsubstituted $C_1$-$C_{30}$ alkyl groups, substituted or unsubstituted $C_1$-$C_{30}$ heteroalkyl groups, substituted or unsubstituted $C_1$-$C_{30}$ alkoxy groups, substituted or unsubstituted $C_1$-$C_{30}$ heteroalkoxy groups, substituted or unsubstituted $C_6$-$C_{30}$ aryl groups, substituted or unsubstituted $C_6$-$C_{30}$ arylalkyl groups, substituted or unsubstituted $C_6$-$C_{30}$ aryloxy groups, substituted or unsubstituted $C_2$-$C_{30}$ heteroaryl groups, substituted or unsubstituted $C_2$-$C_{30}$ heteroarylalkyl groups substituted or unsubstituted $C_2$-$C_{30}$ heteroaryloxy groups, substituted or unsubstituted $C_5$-$C_{30}$ cycloalkyl groups, substituted or unsubstituted $C_2$-$C_{30}$ heterocycloalkyl groups, substituted or unsubstituted $C_1$-$C_{30}$ alkylester groups, substituted or unsubstituted $C_1$-$C_{30}$ heteroalkylester groups, substituted or unsubstituted $C_6$-$C_{30}$ arylester groups, and substituted or unsubstituted $C_2$-$C_{30}$ heteroarylester groups, wherein at least one hydrogen bound to carbon of A is optionally substituted with a functional group;

B is an ionic group or an ionic compound comprising a cation and an anion paired with each other; and C is

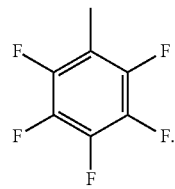

2. The conductive copolymer according to claim 1, wherein said cation is selected from the group consisting of metal ions and organic ions.

3. The conductive copolymer according to claim 2, wherein said metal ions are selected from the group consisting of $Na^+$, $K^+$, $Li^+$, $Mg^{2+}$, $Zn^{2+}$ and $Al^{3+}$; and said organic ions, are selected from the group consisting of $H^+$, $NH_3^+$ and $CH_3(-CH_2-)_n$, wherein n is an integer from 1 to 50.

4. The conductive copolymer according to claim 1, wherein said anion is selected from the group consisting of $PO_3^-$, $SO_3^-$, $COO^-$, $I^-$ and $CH_3COO^-$.

5. The conductive copolymer according to claim 1, wherein said cation is $H^+$ and said anion is $SO_3^-$.

6. The conductive copolymer according to claim 1, wherein A is a substituted or unsubstituted $C_6$-$C_{30}$ aryl group.

7. The conductive copolymer according to claim 6, wherein A is phenyl.

8. The conductive copolymer according to claim 1, wherein said polyacid copolymer of Formula 1 comprises a compound of Formula (19) below

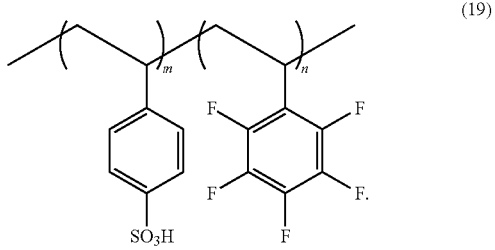

(19)

9. The conductive copolymer according to claim 8, wherein the conductive polymer comprises at least two monomers selected from pyrrole or thiophene represented by the following Formula 4, and derivatives thereof;

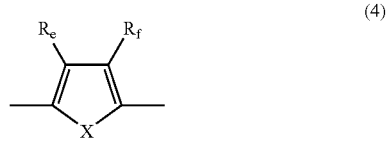

(4)

wherein X is a NH group, or a $C_1$-$C_{20}$ alkyl group or a $C_6$-$C_{20}$ aryl group, wherein each $C_1$-$C_{20}$ alkyl group or $C_6$-$C_{20}$ aryl group is bonded to a heteroatom selected from the group consisting of N, O, P and S; and $R_e$ and $R_f$ are each independently selected from the group consisting of a NH group, $C_1$-$C_{20}$ alkyl groups or $C_6$-$C_{20}$ aryl groups, wherein each $C_1$-$C_{20}$ alkyl group or $C_6$-$C_{20}$ aryl group is bonded to a heteroatom selected from N, O, P and S, $C_1$-$C_{30}$ alkyl groups, $C_6$-$C_{30}$ aryl groups, $C_1$-$C_{30}$ alkoxy groups, $C_1$-$C_{30}$ heteroalkyl groups, $C_1$-$C_{30}$ heteroalkoxy groups, $C_6$-$C_{30}$ arylalkyl groups, $C_6$-$C_{30}$ aryloxy groups, $C_6$-$C_{30}$ arylamine groups, $C_6$-$C_{30}$ pyrrole groups, $C_6$-$C_{30}$ thiophene groups, $C_2$-$C_{30}$ heteroaryl groups, $C_2$-$C_{30}$ heteroarylalkyl groups, $C_2$-$C_{30}$ heteroaryloxy groups, $C_5$-$C_{30}$ cycloalkyl groups, $C_2$-$C_{30}$ heterocycloalkyl groups, $C_1$-$C_{30}$ alkylester groups, $C_1$-$C_{30}$ heteroalkylester groups, $C_6$-$C_{30}$ arylester groups and $C_2$-$C_{30}$ heteroarylester groups, wherein at least one hydrogen bonded to carbon contained in $R_e$ and $R_f$ is optionally substituted with a functional group.

10. The conductive copolymer according to claim 1, wherein the conductive polymer comprises at least two monomers selected from the group consisting of polyphenylene, polyphenylenevinylene, polyaniline represented by the following Formula 3 and derivatives thereof; pyrrole or thiophene represented by the following Formula 4, and derivatives thereof; and cyclic compounds represented by the following Formula 5 and derivatives thereof:

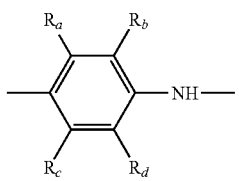
(3)

wherein $R_a$, $R_b$, $R_c$ and $R_d$ are each independently selected from the group consisting of hydrogen, $C_1$-$C_{30}$ alkyl groups, $C_1$-$C_{30}$ heteroalkyl groups, $C_1$-$C_{30}$ alkoxy groups, $C_1$-$C_{30}$ heteroalkoxy groups, $C_6$-$C_{30}$ aryl groups, $C_6$-$C_{30}$ arylalkyl groups, $C_6$-$C_{30}$ aryloxy groups, $C_6$-$C_{30}$ arylamine groups, $C_6$-$C_{30}$ pyrrole groups, $C_6$-$C_{30}$ thiophene groups, $C_2$-$C_{30}$ heteroaryl groups, $C_2$-$C_{30}$ heteroarylalkyl groups, $C_2$-$C_{30}$ heteroaryloxy groups, $C_5$-$C_{30}$ cycloalkyl groups, $C_2$-$C_{30}$ heterocycloalkyl groups, $C_1$-$C_{30}$ alkylester groups, $C_1$-$C_{30}$ heteroalkylester groups, $C_6$-$C_{30}$ arylester groups and $C_2$-$C_{30}$ heteroarylester groups, wherein at least one hydrogen bonded to carbon contained in $R_a$, $R_b$, $R_c$ and $R_d$ is optionally substituted with a functional group;

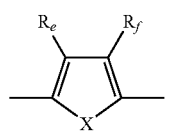
(4)

wherein X is a NH group, or a $C_1$-$C_{20}$ alkyl group or a $C_6$-$C_{20}$ aryl group, wherein each $C_1$-$C_{20}$ alkyl group or $C_6$-$C_{20}$ aryl group is bonded to a heteroatom selected from the group consisting of N, O, P and S; and $R_e$ and $R_f$ are each independently selected from the group consisting of a NH group, $C_1$-$C_{20}$ alkyl groups or $C_6$-$C_{20}$ aryl groups, wherein each $C_1$-$C_{20}$ alkyl group or $C_6$-$C_{20}$ aryl group is bonded to a heteroatom selected from N, O, P and S, $C_1$-$C_{30}$ alkyl groups, $C_6$-$C_{30}$ aryl groups, $C_1$-$C_{30}$ alkoxy groups, $C_1$-$C_{30}$ heteroalkyl groups, $C_1$-$C_{30}$ heteroalkoxy groups, $C_6$-$C_{30}$ arylalkyl groups, $C_6$-$C_{30}$ aryloxy groups, $C_6$-$C_{30}$ arylamine groups, $C_6$-$C_{30}$ pyrrole groups, $C_6$-$C_{30}$ thiophene groups, $C_2$-$C_{30}$ heteroaryl groups, $C_2$-$C_{30}$ heteroarylalkyl groups, $C_2$-$C_{30}$ heteroaryloxy groups, $C_5$-$C_{30}$ cycloalkyl groups, $C_2$-$C_{30}$ heterocycloalkyl groups, $C_1$-$C_{30}$ alkylester groups, $C_1$-$C_{30}$ heteroalkylester groups, $C_6$-$C_{30}$ arylester groups and $C_2$-$C_{30}$ heteroarylester groups, wherein at least one hydrogen bonded to carbon contained in $R_e$ and $R_f$ is optionally substituted with a functional group; and

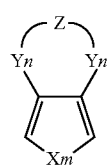
(5)

wherein X is a NH group, a $C_1$-$C_{20}$ alkyl group or a $C_6$-$C_{20}$ aryl group, wherein each $C_1$-$C_{20}$ alkyl group or $C_6$-$C_{20}$ aryl group is bonded to a heteroatom selected from the group consisting of N, O, P and S;

each Y is independently a $C_1$-$C_{20}$ alkyl group or a $C_6$-$C_{20}$ aryl group, wherein each $C_1$-$C_{20}$ alkyl group or $C_6$-$C_{20}$ aryl group is bonded to a heteroatom selected from the group consisting of N, O, P and S;

m and n are independently an integer from 0 to 9; and

Z is $(CH_2)_x$—$CR_gR_h$—$(CH_2)_y$, wherein $R_g$ and $R_h$ are each independently hydrogen, a $C_1$-$C_{20}$ alkyl radical or a $C_6$-$C_{14}$ aryl radical, or —$CH_2$—$OR_i$, wherein $R_i$ is hydrogen, $C_1$-$C_6$ alkyl acid, $C_1$-$C_6$ alkylester, $C_1$-$C_6$ heteroalkyl acid, or $C_1$-$C_6$ alkylsulfonic acid, x and y are each independently an integer from 0 to 5, wherein at least one hydrogen bonded to carbon contained in Z is optionally substituted with a functional group.

11. The conductive copolymer according to claim 1, wherein said conductive polymer comprises 3,4-ethylenedioxythiophene (EDOT).

12. A conductive copolymer composition comprising:

a conductive copolymer comprising a conductive polymer doped with a polyacid copolymer according to claim 1; and a physical or chemical crosslinking agent.

13. The conductive copolymer composition according to claim 12, wherein the conductive polymer comprises at least two monomers selected from the group consisting of polyphenylene, polyphenylenevinylene, polyaniline represented by the following Formula 3 and derivatives thereof; pyrrole or thiophene represented by the following Formula 4 and derivatives thereof; and cyclic compounds represented by the following Formula 5 and derivatives thereof:

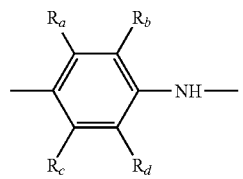
(3)

wherein $R_a$, $R_b$, $R_c$ and $R_d$ are each independently selected from the group consisting of hydrogen, $C_1$-$C_{30}$ alkyl groups, $C_1$-$C_{30}$ heteroalkyl groups, $C_1$-$C_{30}$ alkoxy groups, $C_1$-$C_{30}$ heteroalkoxy groups, $C_6$-$C_{30}$ aryl groups, $C_6$-$C_{30}$ arylalkyl groups, $C_6$-$C_{30}$ aryloxy groups, $C_6$-$C_{30}$ arylamine groups, $C_6$-$C_{30}$ pyrrole groups, $C_6$-$C_{30}$ thiophene groups, $C_2$-$C_{30}$ heteroaryl groups, $C_2$-$C_{30}$ heteroarylalkyl groups, $C_2$-$C_{30}$ heteroaryloxy groups, $C_5$-$C_{30}$ cycloalkyl groups, $C_2$-$C_{30}$ heterocycloalkyl groups, $C_1$-$C_{30}$ alkylester groups, $C_1$-$C_{30}$ heteroalkylester groups, $C_6$-$C_{30}$ arylester groups and $C_2$-$C_{30}$ heteroarylester groups, wherein at least one hydrogen bonded to carbon contained in $R_a$, $R_b$, $R_c$ and $R_d$ is optionally substituted with a functional group;

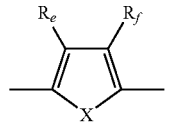
(4)

wherein X is a NH group, or a $C_1$-$C_{20}$ alkyl group or a $C_6$-$C_{20}$ aryl group, wherein each $C_1$-$C_{20}$ alkyl group or $C_6$-$C_{20}$ aryl group is bonded to a heteroatom selected from the group consisting of N, O, P and S; and $R_e$ and $R_f$ are each independently selected from the group consisting of a NH group, $C_1$-$C_{20}$ alkyl groups or $C_6$-$C_{20}$ aryl groups, wherein each $C_1$-$C_{20}$ alkyl group or $C_6$-$C_{20}$ aryl group is bonded to a heteroatom selected from the group consisting of N, O, P and S, $C_1$-$C_{30}$ alkyl groups, $C_6$-$C_{30}$ aryl groups, $C_1$-$C_{30}$ alkoxy groups, $C_1$-$C_{30}$ heteroalkyl groups, $C_1$-$C_{30}$ heteroalkoxy groups, $C_6$-$C_{30}$ arylalkyl groups, $C_6$-$C_{30}$ aryloxy groups, $C_6$-$C_{30}$ arylamine groups, $C_6$-$C_{30}$ pyrrole groups, $C_6$-$C_{30}$ thiophene groups, $C_2$-$C_{30}$ heteroaryl groups, $C_2$-$C_{30}$ heteroarylalkyl groups, $C_2$-$C_{30}$ heteroaryloxy groups, $C_5$-$C_{30}$ cycloalkyl groups, $C_2$-$C_{30}$ heterocycloalkyl groups, $C_1$-$C_{30}$ alkylester groups, $C_1$-$C_{30}$ heteroalkylester groups, $C_6$-$C_{30}$ arylester groups and $C_2$-$C_{30}$ heteroarylester groups, wherein at least one hydrogen bonded to carbon contained in $R_e$ and $R_f$ is optionally substituted with a functional group; and

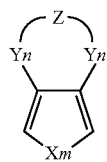
(5)

wherein X is a NH group, a $C_1$-$C_{20}$ alkyl group or a $C_6$-$C_{20}$ aryl group, wherein each $C_1$-$C_{20}$ alkyl group or $C_6$-$C_{20}$ aryl group is bonded to a heteroatom selected from the group consisting of N, O, P and S;

Y is a $C_1$-$C_{20}$ alkyl group or a $C_6$-$C_{20}$ aryl group, wherein each $C_1$-$C_{20}$ alkyl group or $C_6$-$C_{20}$ aryl group is bonded to a heteroatom selected from the group consisting of N, O, P and S;

m and n are independently an integer from 0 to 9; and

Z is $(CH_2)_x$—$CR_gR_h$—$(CH_2)_y$, where $R_g$ and $R_h$ are each independently hydrogen, a $C_1$-$C_{20}$ alkyl radical or a $C_6$-$C_{14}$ aryl radical, or —$CH_2$—$OR_i$, wherein $R_i$ is hydrogen, $C_1$-$C_6$ alkyl acid, $C_1$-$C_6$ alkylester, $C_1$-$C_6$ heteroalkyl acid, or $C_1$-$C_6$ alkylsulfonic acid, wherein at least one hydrogen bonded to carbon contained in Z is optionally substituted with a functional group.

14. The conductive copolymer composition according to claim 12, comprising said physical crosslinking agent in an amount of about 0.001 to about 5 parts by weight, based on 100 parts by weight of the conductive copolymer composition.

15. The conductive copolymer composition according to claim 12, comprising said chemical crosslinking agent in an amount of about 0.001 to about 50 parts by weight, based on 100 parts by weight of the conductive copolymer composition.

16. The conductive copolymer composition according to claim 12, wherein the physical crosslinking agent is selected from the group consisting of glycerol, butanol, polyvinyl alcohol, polyethyleneglycol, polyethylenimine and polyvinylpyrolidone.

17. The conductive copolymer composition according to claim 12, wherein the chemical crosslinking agent is selected from the group consisting of tetraethyloxysilane (TEOS), polyaziridine, melamine polymers and epoxy polymers.

18. The conductive copolymer composition according to claim 12, further comprising a solvent.

19. The conductive copolymer composition according to claim 18, wherein said solvent comprises at least one solvent selected from the group consisting of water, alcohol, dimethylformamide (DMF), dimethylsulfoxide (DMSO), toluene, xylene and chlorobenzene.

20. A conductive copolymer composition film for an organic opto-electronic device prepared from a conductive copolymer composition according to claim 12.

21. An organic opto-electronic device comprising a conductive copolymer composition film according to claim 20.

22. The conductive copolymer according to claim 1, wherein:

A is substituted or unsubstituted $C_6$-$C_{30}$ aryl group; and
B is $SO_3H$.

* * * * *

UNITED STATES PATENT AND TRADEMARK OFFICE
CERTIFICATE OF CORRECTION

PATENT NO. : 7,875,208 B2
APPLICATION NO. : 11/936843
DATED : January 25, 2011
INVENTOR(S) : Dal Ho Huh et al.

Page 1 of 2

It is certified that error appears in the above-identified patent and that said Letters Patent is hereby corrected as shown below:

In the Specification:

Column 2, Line 39 Formula 2 is depicted as:

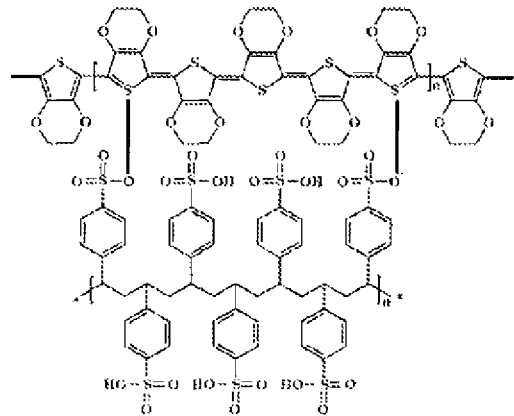

and should be depicted as:

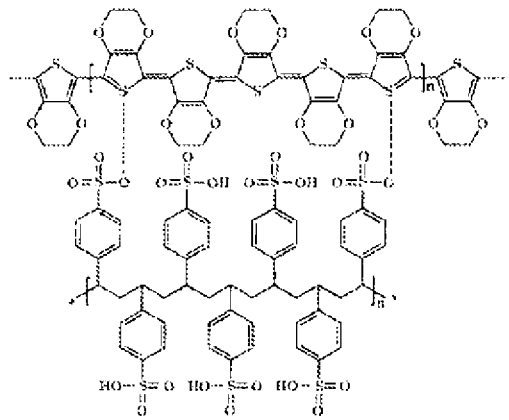

Signed and Sealed this
Thirty-first Day of May, 2011

David J. Kappos
*Director of the United States Patent and Trademark Office*

CERTIFICATE OF CORRECTION (continued)
U.S. Pat. No. 7,875,208 B2

In the Specification:

Column 12, Line 28 Formula 10 is depicted as:

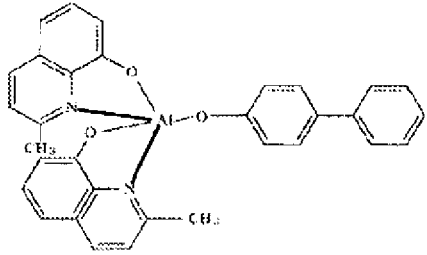

and should be depicted as: